(12) United States Patent
Bedarida et al.

(10) Patent No.: US 6,333,885 B1
(45) Date of Patent: Dec. 25, 2001

(54) CIRCUIT FOR READING A SEMICONDUCTOR MEMORY

(75) Inventors: Lorenzo Bedarida, Vimercate; Vincenzo Dima, Monza, both of (IT); Francesco Brani, Zürich (CH); Marco Defendi, Sulbiate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/603,275

(22) Filed: Jun. 26, 2000

(30) Foreign Application Priority Data

Jun. 25, 1999 (EP) ................................................. 99830403

(51) Int. Cl.⁷ ............................... G11C 7/02; G11C 16/06
(52) U.S. Cl. ...................................... 365/208; 365/185.21
(58) Field of Search .................................. 365/208, 210, 365/185.2, 185.21, 185.22, 189.09

(56) References Cited

U.S. PATENT DOCUMENTS

| | | | |
|---|---|---|---|
| 4,670,675 | * 6/1987 | Donoghue | 307/530 |
| 5,163,021 | * 11/1992 | Mehrotra et al. | 365/185 |
| 5,198,997 | * 3/1993 | Arakawa | 365/185 |
| 5,289,412 | 2/1994 | Frary et al. | 365/185 |
| 5,541,880 | * 7/1996 | Campardo et al. | 365/189.09 |
| 5,608,676 | * 3/1997 | Medlock et al. | 365/189.09 |
| 5,654,918 | * 8/1997 | Hammick | 365/185.2 |
| 5,805,500 | * 9/1998 | Campardo et al. | 365/185.2 |
| 5,917,753 | * 6/1999 | Dallabora et al. | 365/185.21 |

* cited by examiner

Primary Examiner—Richard Elms
Assistant Examiner—Anh Phung
(74) Attorney, Agent, or Firm—Lisa K. Jorgenson; Allen, Dyer, Doppelt, Milbrath & Gilchrist, P.A.

(57) ABSTRACT

A circuit for reading a semiconductor memory device includes at least one global circuit for generating a global reference signal for a respective plurality of cell-reading circuits disposed locally in the memory device. The circuit includes at least one circuit for replicating the reference signal locally in order to generate a local reference signal to be supplied to at least one respective cell-reading circuit.

30 Claims, 4 Drawing Sheets

CIRCUIT FOR READING A SEMICONDUCTOR MEMORY

FIELD OF THE INVENTION

The present invention relates to the field of semiconductor memories, and more particularly, to circuits for reading the ROM, EPROM, EEPROM and Flash EEPROM type semiconductor memories.

BACKGROUND OF THE INVENTION

Semiconductor-memory reading circuits perform a comparison between two currents (or voltages) to read the data stored in memory cells. A current (or voltage) of a memory cell selected for reading is compared with a reference current (or voltage). The reference currents (or voltages) for the reading circuits are typically generated with the use of reference memory cells which are structurally identical to the memory cells and are programmed to predetermined levels, typically during the testing of the individual memory device.

There is a need to provide memories with ever larger bandwidths and ever lower energy consumption per individual bit. This need is imposed by the ever higher performance of electronic systems. On the other hand, the time required to perform reading cannot be reduced indefinitely since it is limited by physical constraints such as the charging time of the word lines of the memory. To achieve a greater bandwidth, it is therefore necessary to perform several cell readings in parallel. To be able to perform several readings in parallel, it is necessary to increase the number of cell-reading circuits and of respective circuits for generating reference currents (or voltages). This results in a significant increase in the area and energy consumption of the memory device.

To limit the increase in area and consumption, attempts have been made to limit the number of circuits for generating reference currents (or voltages). The same reference signal (current or voltage) generated at one point of the device is thus supplied to several cell-reading circuits by bringing the reference signal (current or voltage) to the various points of the device at which the reading circuits are arranged. The limiting of the number of reference-signal generating circuits brings advantages both in terms of area and in terms of consumption, and also in terms of the time required to test the individual device, since the number of reference cells to be programmed to the desired levels is reduced.

However, since the reference signal has to travel considerable distances inside the device, a large parasitic capacitance associated with the reference-signal distribution lines degrades the reference signal. It is also necessary to add the capacitances of the input nodes of the various cell-reading circuits which the reference signal supplies. The time required for the reference signal to reach the predetermined steady value therefore increases and the bandwidth of the memory device is limited. Moreover, since the various cell-reading circuits are coupled capacitively to the reference signal, the intrinsic imbalances in their operation in the course of the reading of the respective memory cells selected may cause errors in the reading, particularly when they are reading memory cells with large margins (distances between thresholds) involving large current or voltage ranges which alter the value of the reference signal.

SUMMARY OF THE INVENTION

In view of the prior art described, an object of the present invention is to provide a reading circuit for a memory device which solves the above-mentioned problems.

According to the present invention, this object is achieved by a circuit for reading semiconductor memory devices comprising at least one global circuit for generating a global reference signal for a respective plurality of cell-reading circuits disposed locally in the memory device. Specifically, the reading circuit comprises at least one circuit for replicating the reference signal locally to generate a local reference signal to be supplied to at least one respective cell-reading circuit.

BRIEF DESCRIPTION OF THE DRAWINGS

The characteristics and advantages of the present invention will become clearer from the following detailed description of a practical embodiment thereof, illustrated purely by way of non-limiting example in the appended drawings, in which.

DETAILED DESCRIPTION OF THE PREFERRED EMBODIMENTS

Figure 1:
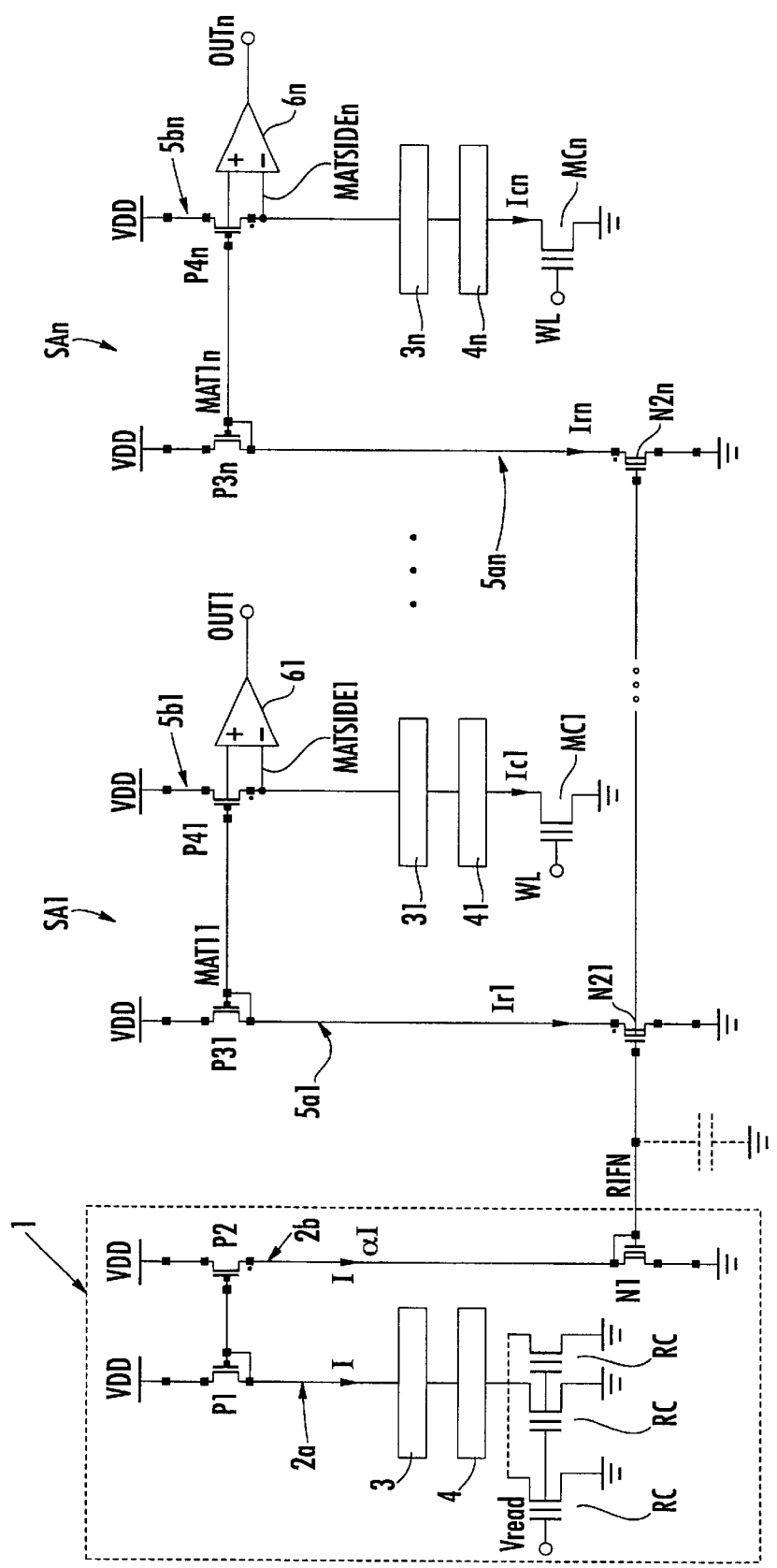
FIG. 1 is a basic circuit diagram of a reading circuit for a memory device according to the present invention with a plurality of cell-reading circuits.

With reference to FIG. 1, a reading circuit for a memory device according to the present invention comprises a circuit 1 for generating a global reference signal RIFN for a plurality of cell-reading circuits SA1–SAn disposed locally. The circuit 1 is located at one point of the memory device. The cell-reading circuits SA1–SAn, however, are distributed at various points in the memory device.

The circuit 1 comprises a current mirror with a first branch 2a and a second branch 2b. The branch 2a comprises a p-channel MOSFET P1 connected as a diode with its source connected to a voltage VDD, which is typically, but not exclusively, the supply voltage of the memory device (for example, of 5 V or 3 V or less). Connected in cascade in series with the MOSFET P1 are a circuit 3 for biasing the drains of the reference cells, a circuit 4 for selecting the columns of reference cells, and one or more reference cells RC, which are typically MOSFETs with floating gates but in any case are of the same type as the actual memory cells but are programmed to a predetermined level to conduct a known current when biased. The reference cells RC have their sources connected to ground and their control gates connected to a reading voltage Vread which can adopt different values depending on the mode of operation of the memory device (reading, verification, etc.). The second branch 2b comprises a p-channel MOSFET P2 of which the source is connected to the supply VDD and the gate is connected to the gate of the MOSFET P1 in the first branch 2a, and in series with which an n-channel MOSFET N1, preferably of the so-called "natural" type, i.e. with a relatively low threshold voltage, is connected as a diode, with its source connected to ground.

Each cell-reading circuit SA1–SAn comprises a local current mirror with a first branch 5a1–5an and a second branch 5b1–5bn. The first branch 5a comprises a p-channel MOSFET P31–P3n which has its source connected to the supply VDD and is in a diode configuration, and in series with which an n-channel MOSFET N21–N2n, preferably of the natural type is connected, with its source connected to ground and its gate connected to the global reference signal RIFN. It should be noted that the first branch 5a1–5an of each local current mirror also forms the second branch of a further semi-local current mirror, the first branch of which is formed by the second branch 2b of the circuit 1.

The second branch 5b1–5bn of each local current mirror comprises a p-channel MOSFET P41–P4n with its source connected to the supply VDD and its gate connected to the gate of the MOSFET P31–P3n in the first branch 5a1–5an. Connected in cascade in series with the MOSFET P41–P4n are a circuit 31–3n, similar to the circuit 3, for biasing the drains of the memory cells, a circuit 41–4n for selecting the columns of the matrix of memory cells and, finally, a memory cell MC1–MCn which, in the drawings, represents schematically the memory cell belonging to the column selected by the circuit 4 and to the line WL selected by a line-selection circuit which is not shown since it is of known type.

The gate of the MOSFET P31 (the node MAT11–MAT1n) supplies a non-inverting input of a comparator 61–6n, the inverting input of which is connected to the drain of the MOSFET P41–P4n. The output OUT1–OUTn of the comparator 61–6n is supplied, by a circuit chain which may comprise one or more inverters and latches, to a respective output buffer, which is not shown since it is known.

The circuit of FIG. 1 operates as follows. If there is a single reference cell RC, a current I which flows in the branch 2a of the circuit 1 is the current absorbed by the reference cell biased with approximately 1 V at its drain (value set by the circuit 3) and the voltage Vread at its control gate. When there are several reference cells RC in parallel, the current I will be a whole multiple of the current absorbed by a single reference cell. The MOSFET P1 mirrors the current I in the second branch 2b with a mirror coefficient a given by the aspect ratios (width/length) of the MOSFETs P1 and P2. In the second branch 2b, there is therefore a current aI proportional to the current I, preferably a whole multiple thereof. The current aI flowing in the MOSFET N1 produces a global voltage reference signal RIFN which is brought to the various points of the memory device at which the cell-reading circuits SA1–SAn are situated.

With reference, for example, to the circuit SA1, the global reference signal RIFN imposes in the branch 5a1, through the MOSFET N21, a current Ir1 proportional to the current aI with a proportionality factor depending on the aspect ratios of the MOSFETs N1 and N21. The current Ir1 produces a local voltage reference signal MAT11 which biases the gate of the MOSFET P41 in the branch 5b1 and is also supplied to the non-inverting input of the comparator 61. In the branch 5b1, the signal MAT11 tries to impose a current proportional to the current Ir1, whereas the memory cell MC1 selected for reading, which is biased in similar conditions to the reference cells RC, that is, with its drain kept at approximately 1V by the circuit 31 and its control gate at the reading voltage Vread, absorbs a current Ic1 which depends on its programming conditions. The difference between the current which the local reference signal MAT11 tries to impose in the branch 5b1 and the current Ic1 absorbed by the cell being read brings about an imbalance between the nodes MAT11 and MATSIDE1, and hence in the inputs of the comparator 61, the value of the output OUT1 of which depends on this imbalance. The aspect ratios of the MOSFETs P1, P2, N1, N21, P31 and P41 are typically selected in a manner such that the current which is mirrored in the branch 5b1 is equal to a fraction of, for example, one half of, or is equal to, the current absorbed by a reference cell RC.

Clearly, the node MATSIDE1-MATSIDEn is coupled capacitively (via the respective MOSFET P41–P4n) to the signal MAT11-MAT1n, but is not coupled directly to the global reference signal RIFN. Thus although, in the reading circuit described, a single circuit 1 is used for generating the global reference signal RIFN which is supplied to a plurality of cell-reading circuits distributed in the memory device, the reference signal RIFN is not influenced by the imbalances which are brought about in the branches 5b1–5bn (matrix branches) of the various reading circuits SA1–SAn. There is therefore no risk that the reading of a memory cell with a high margin will result in an incorrect reading of that cell or of the other memory cells, owing to the large imbalance which the reading brings about.

Moreover, since local mirroring is provided for by the branches 5a1–5an to derive locally, from the global reference signal RIFN, the local reference signal MAT11-MAT1n, from which a current signal is obtained in the branch 5b1–5bn for comparison with the current absorbed by the memory cell, it is possible to start with a reference current I higher than that generated by a single reference cell. In other words, it is possible to use several reference cells in parallel and also to generate, by mirroring in the branch 2b, a current aI such that the time required for the global reference signal RIFN to reach the steady value necessary for a correct reading to be taken can be reduced (a higher current aI permits quicker charging of the parasitic capacitances associated with the signal RIFN).

Although, in the foregoing description, a local mirror branch 5a1–5an for each cell-reading circuit SA1–SAn has been indicated, that is, a number of local mirror branches equal to the number of cell-reading circuits, it is also possible to provide a local mirror branch associated with a respective group of cell-reading circuits, thus reducing the number of local mirror branches.

Figure 2:
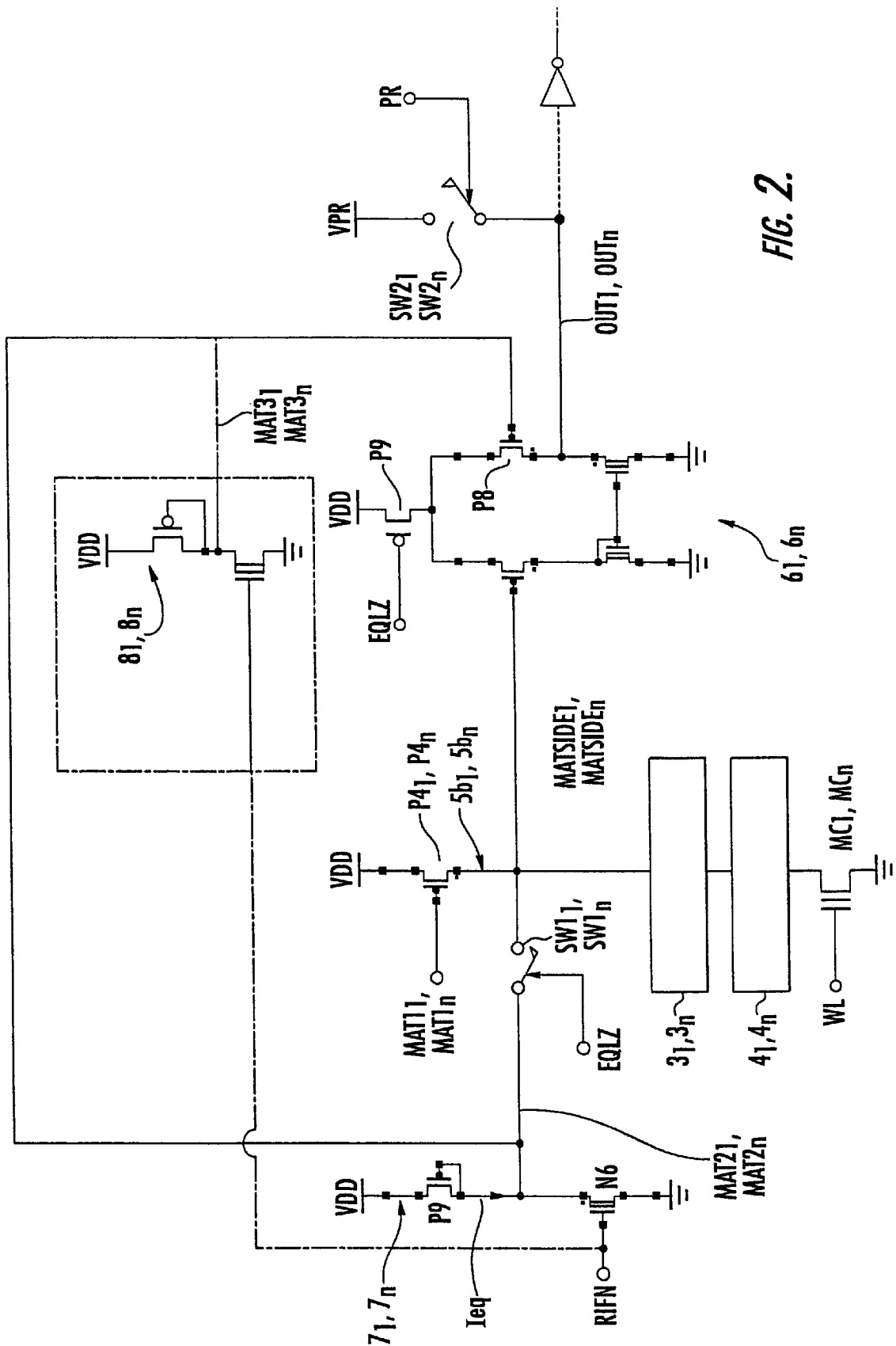
FIG. 2 is a more detailed circuit diagram of a cell-reading circuit, with respective equalization and precharging circuits.

FIG. 2 shows one of the cell-reading circuits of FIG. 1 in greater detail, complete with the respective precharging and equalization circuits. As well as being used for generating the reference current Ir1 locally, the global reference signal RIFN also generates a signal MAT21–MAT2n by a further local mirror branch 71–7n similar to the branch 5a1–5an. This signal can be connected to the node MATSIDE1-MATSIDEn, by a switch SW11–SW1n controlled by an equalization signal EQLZ. Moreover, the non-inverting input of the comparator 61–6n is supplied by the signal MAT21–MAT2n instead of being supplied by the signal MAT11–MAT1n as shown in FIG. 1. Alternatively, as also shown in FIG. 2, the non-inverting input of the comparator 61–6n may be supplied by a further signal MAT31-MAT3n, also generated from the global reference signal RIFN, by a further mirror branch 81–8n similar to the branch 7a–7n.

Finally, FIG. 2 shows a MOSFET P9, controlled by the signal EQLZ, for enabling the comparator 61–6n, and a circuit for precharging the output OUT1–OUTn of the comparator 61–6n which can be connected, by a switch SW21–SW2n, controlled by a precharging signal PR, to a precharging signal VPR. The precharging signal VPR is typically equal to the triggering threshold of a first inverter in the circuit chain downstream of the comparator.

Figure 3:
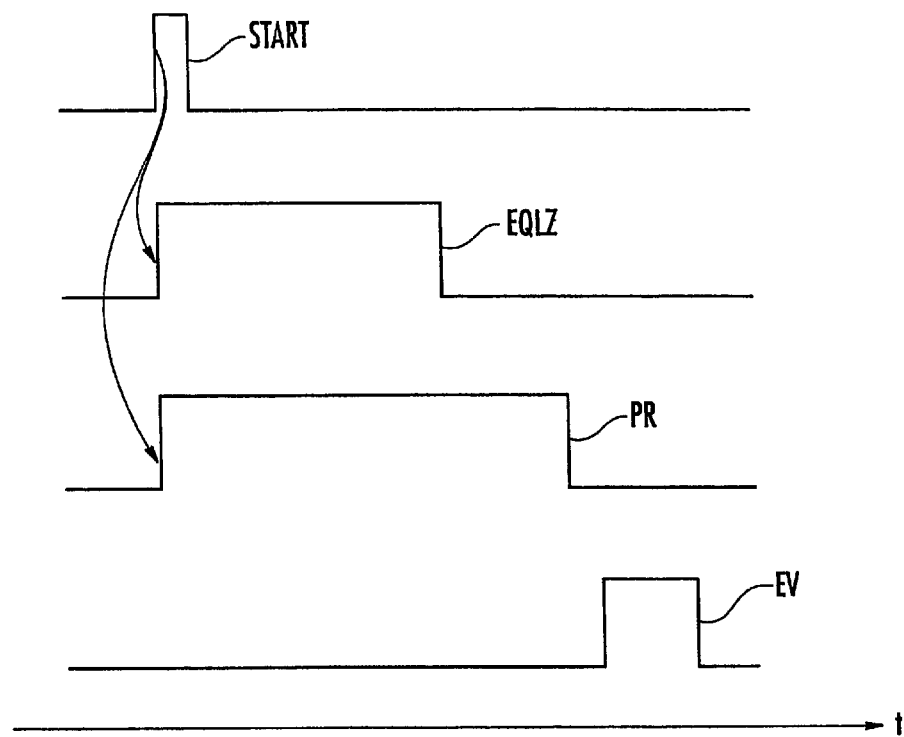
FIGS. 3 and 4 show two different timing diagrams of the main signals during a reading of the memory device.

With reference also to FIG. 3, which shows a conventional timing scheme for reading in a memory device, the start of the reading operation is dictated by a signal START, which is activated, for example, upon the transition of the memory-addressing signals. The START signal brings about, among other things, the activation of the signal EQLZ which closes the switches SW11–SW1n, short-circuiting the nodes MATSIDE1–MATSIDEn to the nodes MAT21–MAT2n which are replicas of the signals MAT11–MAT1n. The two branches of each cell-reading circuit (the reference branch 5a1–5an and the matrix branch 5b1–5bn) are thus equalized until the reference current and the current of the cell being read reach the steady value, that is, until the matrix line to which the matrix cell and the reference cell belong has been brought to the desired voltage.

At the same time, the precharging signal PR is activated and connects the outputs of the comparators 61–6n to the precharging signal VPR. The signal EQLZ is then deactivated, the switches SW11–SW1n are opened, the equalization is interrupted and the nodes MATSIDE1–MATSIDEn are allowed to develop freely in dependence on the current absorbed by the respective cells being read. The precharging signal PR still remains active after the equalization has finished, and is then deactivated and the outputs OUT1–OUTn of the comparators are left free to adopt the value corresponding to the signals at their inputs. Finally, the activation of the signal EV brings about evaluation of the output of the comparators.

The local mirror branches 71–7n for generating the signals MAT21–MAT2n are advantageously such that the current Ieq (the equalization current) which flows in them is greater than the current which flows in the branches 5b1–5bn so that, although the signal MAT21–MAT2n is equal in value to the signal MAT11–MAT1n, it is sufficiently robust and stable not to be influenced by variations in the signal MATSIDE1–MATSIDEn. In other words, the p-channel MOSFET P9 and the n-channel MOSFET N6 have aspect ratios such that, although the signal MAT21–MAT2n has a value substantially equal to that of the signal MAT11–MAT1n, the mirror ratio of the current aI in the branches 71–7n is greater than the mirror ratio of the current aI in the branches 5b1–5bn. Thus, upon completion of the equalization stage, when the signal MAT21–MAT2n is no longer short-circuited to the signal MATSIDE1–MATSIDEn, the p-channel MOSFET P8 (the input of the differential stage of the comparator 61–6n) is still switched on. If the cell being read is a "0" with a high margin, the signal OUT1–OUTn starts to rise in voltage as soon as the equalization stage ends and does not have to wait for the resetting of the signal MAT21–MAT2n as would be necessary if the latter signal were influenced by the voltage value of the signal MATSIDE1–MATSIDEn.

The insertion of the further local mirror branch 81–8n for generating the signal MAT31-MAT3n, which is independent of the signal MAT21–MAT2n, provides even greater certainty that the reference input (the non-inverting input) of the comparator 61–6n is not influenced by the voltage of the signal MATSIDE1–MATSIDEn. It is noted that what is described above, in particular, the generation of the local signal MAT21–MAT2N by mirroring of the reference signal but with a higher mirror ratio, is not applicable exclusively to the reading circuit of FIG. 1, but may also be applied to conventional reading circuits.

Figure 4:
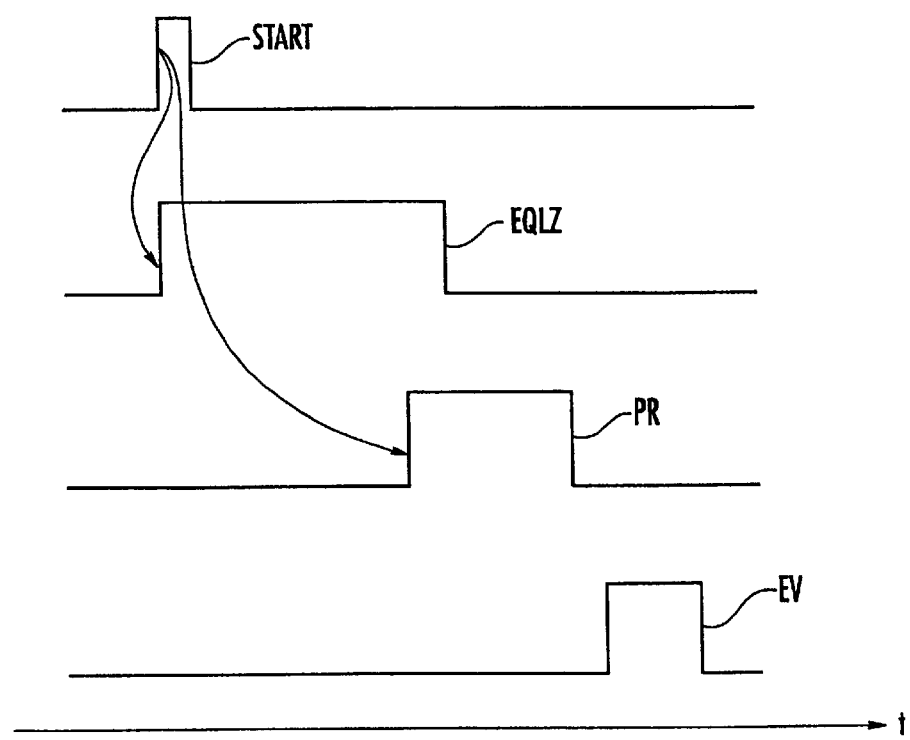

FIG. 4 shows a reading timing scheme which is novel and particularly advantageous in comparison with that of FIG. 3. In contrast with the conventional timing scheme, the signal PR for precharging the outputs of the comparators is not activated simultaneously with the activation of the equalization signal EQLZ but subsequently, but nevertheless before the end of the equalization stage (the deactivation of the signal EQLZ which also brings about enabling of the comparator 61–6n by the MOSFET P9). That is to say, the duration of the stage in which the outputs of the comparators are precharged is reduced, thus considerably reducing consumption. It is noted that this new and advantageous timing scheme is not exclusively usable in the reading circuit of FIG. 1 but may also be used in conventional reading circuits and, in any case, in all reading circuits in which an equalization of the comparator inputs and a precharging of the comparator outputs take place.

To return to FIG. 2, the switches SW11–SW1n are normally formed by a simple transfer gate, that is, an n-channel MOSFET and a p-channel MOSFET with their terminals connected to one another and their gates controlled by the signal EQLZ and EQLZN (the logic complement of EQLZ), respectively. However, since the capacitive coupling between the signal EQLZ and the node MATSIDE1–MATSIDEn is different from the capacitive coupling between this latter node and the signal EQLZN, upon completion of the equalization (when the switch SW11–SW1n is opened) the voltage value at the node MATSIDE1–MATSIDEn differs from that at the node MAT11–MAT1n. This introduces a dynamic offset at the input of the comparator and, since a certain time is required to compensate for this offset, the time required to complete the reading increases.

Figure 5:
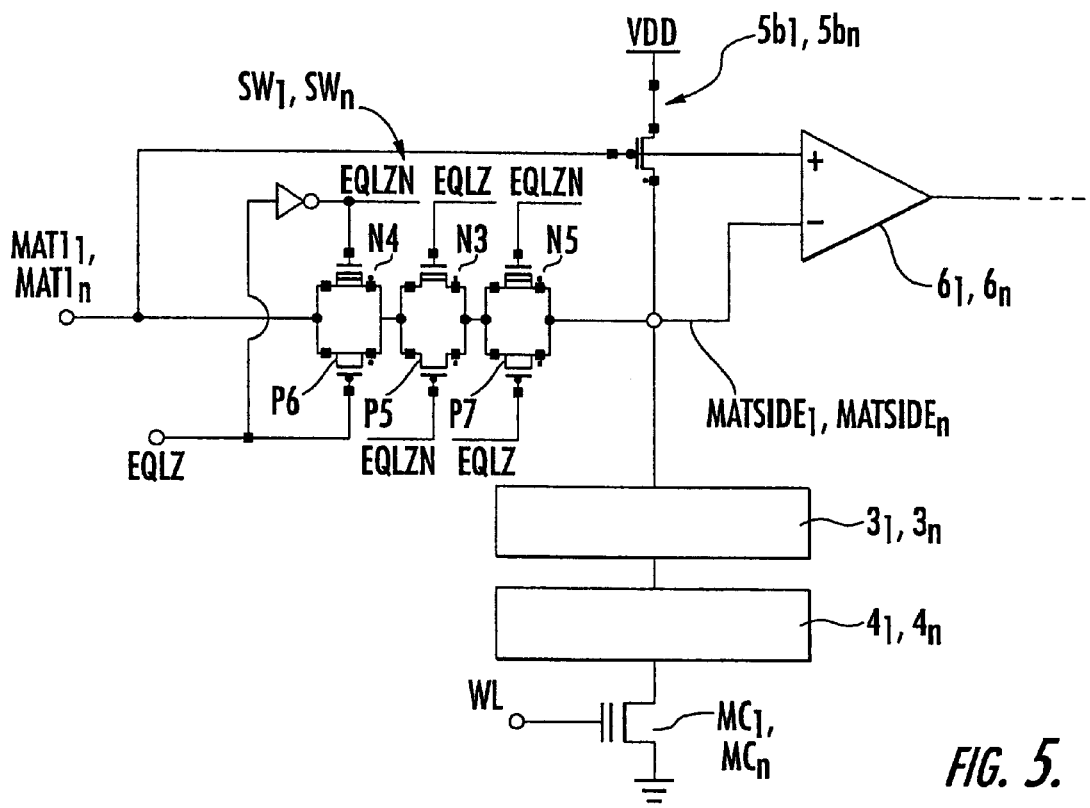
FIG. 5 is a circuit diagram of a preferred embodiment of an equalization switch for the cell-reading circuit of FIG. 2.

FIG. 5 shows in detail an embodiment of the switch SW11–SW1n which solves the problem just described. Instead of a simple transfer gate, the switch SW11–SW1N comprises a transfer gate formed by MOSFETs N3 and P5, which are controlled by the signals EQLZ and EQLZN, respectively, and two further, false transfer gates, one upstream, formed by MOSFETs N4 and P6, which are controlled by the signals EQLZN and EQLZ respectively, and one downstream, formed by MOSFETs N5 and P7, which are also controlled by the signals EQLZN and EQLZ, respectively. In both of the two false transfer gates, the MOSFETs N4, P6, N5, P7 have their respective drains and sources short-circuited so as not to alter the low-frequency behaviour of the reading circuit.

Figure 6:
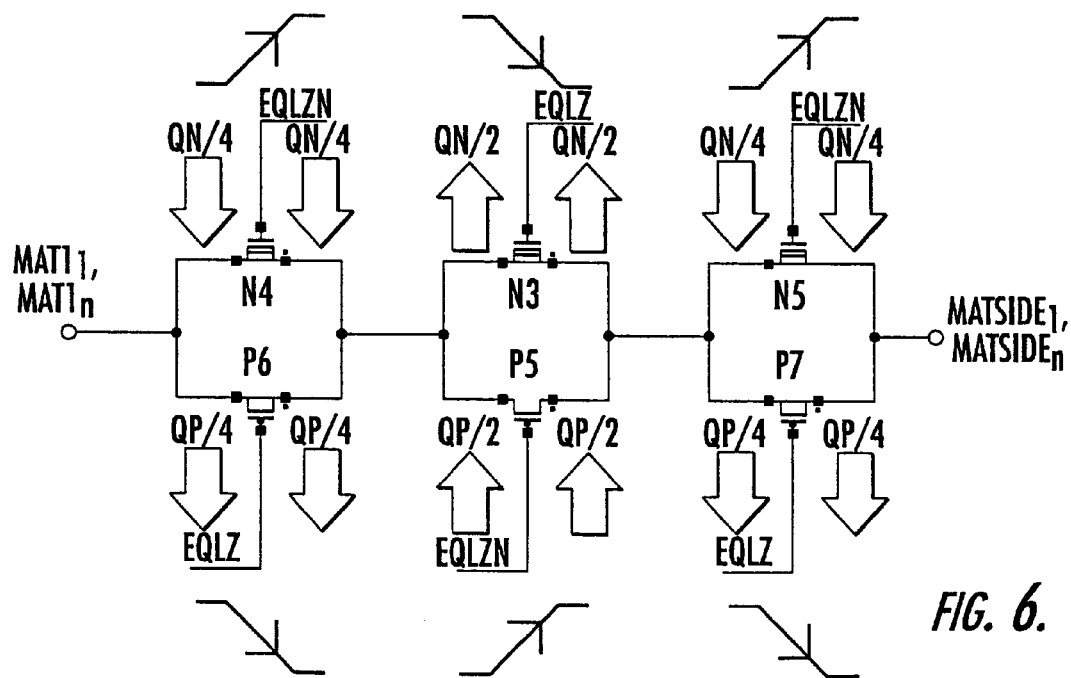
FIG. 6 is a drawing explaining the operating principle of the equalization switch of FIG. 3.

With reference to FIG. 6, which illustrates the operating principle of the circuit of FIG. 5, it will be noted that when, upon completion of the equalization stage, the signal EQLZ switches from the high state to the low state, the charge removed by division by the MOSFET N3, which is equal to QN/2 on the drain side towards MAT11–MAT1n and QN/2 on the source side towards MATSIDE1–MATSIDEn, is compensated for by the charge injected by the two MOSFETs N4, N5 of the two false transfer gates disposed upstream and downstream, which is equal to QN/4 towards the drain and QN/4 towards the source for each of the two MOSFETs N4 and N5. Similarly, the charge injected by the MOSFET P5, which is equal to QP/2 on the source side and QP/2 on the drain side, is compensated for by the charge extracted by the two MOSFETs P6, P7 of the two false transfer gates disposed upstream and downstream, which is equal to QP/4 towards the drain and QP/4 towards the source for each of the two MOSFETs P6, P7. No dynamic offset is thus introduced and the time required to complete the reading operation is reduced. Naturally, similar considerations also apply to the switches SW21–SW2n of FIG. 2. It is noted that the equalization switch of FIGS. 5 and 6 is not exclusively usable in the reading circuit of FIG. 1, but may also be used in reading circuits of other types, for example, in conventional or other circuits and, in general, in all circuits in which a stage of finite duration is provided for equalizing two nodes.

That which is claimed is:

1. A circuit for reading cells of a semiconductor memory device comprising:
   a plurality of cell-reading circuits;
   a global circuit in the memory device for generating a global reference signal for the plurality of cell-reading circuits, the global circuit comprising a current mirror having a first branch comprising a reference-current generator and a second branch in which a second current proportional to a first current in the first branch flows; and
   at least one signal replicating circuit for replicating the global reference signal locally to generate a local reference signal to be supplied to at least one of the plurality of cell-reading circuits, the at least one local replicating circuit forming, with the second branch of the global circuit, a semi-local current mirror.

2. A circuit according to claim 1, wherein the at least one signal replicating circuit comprises a respective local replicating circuit for each of the plurality of cell-reading circuits.

3. A circuit according to claim 1, wherein the at least one signal replicating circuit comprises a plurality of local replicating circuits, each associated with a group of cell-reading circuits.

4. A circuit according to claim 1, wherein the second current is a multiple of the first current.

5. A circuit according to claim 4, wherein the at least one signal replicating circuit comprises a respective local replicating circuit for each of the plurality of cell-reading circuits; wherein each of the plurality of cell-reading circuits comprises a cell circuit branch forming, with a respective local replicating circuit, a local current mirror; and wherein the local reference signal produces, in the cell circuit branch, a signal for comparison with a cell being read.

6. A circuit according to claim 5, wherein the local replicating circuit comprises a circuit branch in which a third current flows and which is proportional to the first current which flows in the first branch of the global circuit.

7. A circuit according to claim 6, wherein each of the plurality of cell-reading circuits comprises a precharging circuit for precharging the cell circuit branch, the precharging circuit comprising:
   a second local replicating circuit for replicating the global reference signal, capable of supplying a larger driving current than the local replicating circuit; and
   a switch for connecting an output of the second local replicating circuit to the cell circuit branch.

8. A circuit according to claim 7, wherein each cell-reading circuit further comprises a comparison circuit having inputs respectively connected to the second local replicating circuit and the cell circuit branch.

9. A circuit according to claim 7, wherein each cell-reading circuit further comprises:
   a third local replicating circuit for replicating the global reference signal; and
   a comparison circuit having inputs connected to the third local replicating circuit and the cell circuit branch.

10. A circuit according to claim 7, wherein the switch comprises:
    an active transfer gate which is activated by an equalization signal; and
    an upstream transfer gate and a downstream transfer gate controlled by logic signals which are opposites of the equalization signal.

11. A semiconductor memory device comprising:
    a plurality of memory cells; and
    a circuit for reading the plurality of memory cells comprising
        a plurality of cell-reading circuits,
        a global circuit for generating a global reference signal for the plurality of cell-reading circuits, and comprising a current mirror having a first branch with a reference-current generator and a second branch in which a second current proportional to a first current in the first branch flows, and
        at least one signal replicating circuit for replicating the global reference signal to generate a local reference signal to be supplied to at least one of the plurality of cell-reading circuits, the at least one local replicating circuit forming, with the second branch of the global circuit, a semi-local current mirror.

12. A semiconductor memory device according to claim 11, wherein the at least one signal replicating circuit comprises a respective local replicating circuit for each of the plurality of cell-reading circuits.

13. A semiconductor memory device according to claim 11, wherein the at least one signal replicating circuit comprises a plurality of local replicating circuits, each associated with a group of cell-reading circuits.

14. A semiconductor memory device according to claim 11, wherein the second current is a multiple of the first current.

15. A semiconductor memory device according to claim 14, wherein the at least one signal replicating circuit comprises a respective local replicating circuit for each of the plurality of cell-reading circuits; wherein each of the plurality of cell-reading circuits comprises a cell circuit branch forming, with a respective local replicating circuit, a local current mirror; and wherein the local reference signal produces, in the cell circuit branch, a signal for comparison with a cell being read.

16. A semiconductor memory device according to claim 15, wherein the local replicating circuit comprises a circuit branch in which a third current flows and which is proportional to the first current which flows in the first branch of the global circuit.

17. A semiconductor memory device according to claim 16, wherein each of the plurality of cell-reading circuits comprises a precharging circuit for precharging the cell circuit branch, the precharging circuit comprising:
    a second local replicating circuit for replicating the global reference signal, capable of supplying a larger driving current than the local replicating circuit; and
    a switch for connecting an output of the second local replicating circuit to the cell circuit branch.

18. A semiconductor memory device according to claim 17, wherein each cell-reading circuit further comprises a comparison circuit having inputs respectively connected to the second local replicating circuit and the cell circuit branch.

19. A semiconductor memory device according to claim 17, wherein each cell-reading circuit further comprises:
    a third local replicating circuit for replicating the global reference signal; and
    a comparison circuit having inputs connected to the third local replicating circuit and the cell circuit branch.

20. A semiconductor memory device according to claim 17, wherein the switch comprises:

an active transfer gate which is activated by an equalization signal; and an upstream transfer gate and a downstream transfer gate controlled by logic signals which are opposites of the equalization signal.

21. A method for reading cells of a semiconductor memory device comprising a plurality of cell-reading circuits, and a global circuit for generating a global reference signal for the plurality of cell-reading circuits, the global circuit comprising a current mirror having a first branch with a reference-current generator and a second branch in which a second current proportional to a first current in the first branch flows, the method comprising:

replicating the global reference signal with at least one signal replicating circuit to generate a local reference signal, the at least one local replicating circuit forming, with the second branch of the global circuit, a semi-local current mirror; and supplying at least one of the plurality of cell-reading circuits with the local reference signal to read the cells of the semiconductor memory device.

22. A method according to claim 21, wherein the at least one signal replicating circuit comprises a respective local replicating circuit for each of the plurality of cell-reading circuits.

23. A method according to claim 21, wherein the at least one signal replicating circuit comprises a plurality of local replicating circuits, each associated with a group of cell-reading circuits.

24. A method according to claim 21, wherein the second current is a multiple of the first current.

25. A method according to claim 24, wherein the at least one signal replicating circuit comprises a respective local replicating circuit for each of the plurality of cell-reading circuits; wherein each of the plurality of cell-reading circuits comprises a cell circuit branch forming, with a respective local replicating circuit, a local current mirror; and wherein the local reference signal produces, in the cell circuit branch, a signal for comparison with a cell being read.

26. A method according to claim 25, wherein the local replicating circuit comprises a circuit branch in which a third current flows and which is proportional to the first current which flows in the first branch of the global circuit.

27. A method according to claim 26, wherein each of the plurality of cell-reading circuits comprises a precharging circuit for precharging the cell circuit branch, the precharging circuit comprising:

a second local replicating circuit for replicating the global reference signal, capable of supplying a larger driving current than the local replicating circuit; and a switch for connecting an output of the second local replicating circuit to the cell circuit branch.

28. A method according to claim 27, wherein each cell-reading circuit further comprises a comparison circuit having inputs respectively connected to the second local replicating circuit and the cell circuit branch.

29. A method according to claim 27, wherein each cell-reading circuit further comprises:

a third local replicating circuit for replicating the global reference signal; and a comparison circuit having inputs connected to the third local replicating circuit and the cell circuit branch.

30. A method according to claim 27, wherein the switch comprises:

an active transfer gate which is activated by an equalization signal; and an upstream transfer gate and a downstream transfer gate controlled by logic signals which are opposites of the equalization signal.

* * * * *